US008178870B2

(12) United States Patent
Okumoto

(10) Patent No.: US 8,178,870 B2

(45) Date of Patent: May 15, 2012

(54) ORGANIC ELECTROLUMINESCENCE ELEMENT

(75) Inventor: Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 12/665,147

(22) PCT Filed: Apr. 14, 2009

(86) PCT No.: PCT/JP2009/001710

§ 371 (c)(1),
(2), (4) Date: Dec. 17, 2009

(87) PCT Pub. No.: WO2009/130858

PCT Pub. Date: Oct. 29, 2009

(65) Prior Publication Data

US 2010/0187513 A1 Jul. 29, 2010

(30) Foreign Application Priority Data

Apr. 23, 2008 (JP) ................................ 2008-112304

(51) Int. Cl.
*H01L 51/00* (2006.01)

(52) U.S. Cl. ..... 257/40; 257/94; 257/103; 257/E51.018; 257/E51.019; 438/99; 438/46; 438/47

(58) Field of Classification Search .................... 257/40, 257/94, 103, E51.018, E51.019; 438/99, 438/46, 47

See application file for complete search history.

(56) References Cited

U.S. PATENT DOCUMENTS 6,284,393 B1 9/2001 Hosokawa et al.
6,452,218 B1 * 9/2002 Cao .............................. 257/103
6,720,573 B2 4/2004 Son et al.
2002/0158242 A1 10/2002 Son et al.
2004/0004433 A1 1/2004 Lamansky et al.
2004/0113547 A1 6/2004 Son et al.
2004/0164294 A1 8/2004 Son et al.
2004/0169175 A1 9/2004 Son et al.
2004/0214041 A1 * 10/2004 Lu et al. ........................ 428/690
2005/0127824 A1 6/2005 Mori et al.
2005/0191776 A1 9/2005 Lamansky et al.
2006/0038484 A1 2/2006 Noh et al.
2007/0057630 A1 3/2007 Nishita et al.
2007/0079927 A1 4/2007 Lamansky et al.
2007/0181874 A1 * 8/2007 Prakash et al. .................. 257/40
2007/0257605 A1 11/2007 Son et al.
2008/0001532 A1 1/2008 Son et al.
2008/0135835 A1 * 6/2008 Seo et al. ........................ 257/40
2009/0284141 A1 11/2009 Sakanoue et al.

FOREIGN PATENT DOCUMENTS

JP 2003-519432 6/2003

(Continued)

OTHER PUBLICATIONS

M. Pope et al., "Electroluminescence in Organic Crystals", Journal of Chemical Physics, No. 38, 1963, pp. 2042-2043.

(Continued)

*Primary Examiner* — Tu-Tu Ho

(74) *Attorney, Agent, or Firm* — Greenblum & Bernstein, P.L.C.

(57) ABSTRACT

An organic electroluminescence element includes an anode and a transparent electrode cathode. An organic luminescent layer is located between the anode and the cathode. An electron injection layer is located between the cathode and the organic luminescent layer, and includes at least one of an alkali metal and an alkali earth metal to inject electrons into the organic luminescent layer. A cathode buffer layer is located between the electron injection layer and the cathode, and includes a hole-transporting organic material.

7 Claims, 5 Drawing Sheets

1
14 Transparent cathode
16 Cathode buffer layer
15 Electron injection layer
13 Organic layer
12 Anode
11 Substrate

FOREIGN PATENT DOCUMENTS

| | | |
|---|---|---|
| JP | 2004-127740 | 4/2004 |
| JP | 3614405 | 1/2005 |
| JP | 2005-135706 | 5/2005 |
| JP | 2005-531915 | 10/2005 |
| JP | 2007-109882 | 4/2007 |
| JP | 2007-110102 | 4/2007 |
| JP | 2007-230974 | 9/2007 |
| JP | 10-162959 | 6/2008 |
| WO | 01/49806 | 7/2001 |
| WO | 2004/021463 | 3/2004 |

OTHER PUBLICATIONS

C. W. Tang et al., "Organic electroluminescent diodes", Applied Physics Letters, No. 51, 1987, pp. 913-915.

J. H. Burroughes et al., "Light-emitting diodes based on conjugated polymers", Nature, 347, 1990, pp. 539-541.

Y. Shirota et al., "Charge Carrier Transporting Molecular Materials and Their Applications in Devices", Chem. Rev., No. 107, 2007, pp. 953-1010.

X. Zhou et al., "Enhanced Hole Injection into Amorphous Hole-Transport Layers of Organic Light-Emitting Diodes Using Controlled p-Type Doping", Advanced Functional Materials, 11, No. 4, Aug. 2001, pp. 310-314.

J. T. Rademacher et al., "Improved Synthesis of 1,4,5,8,9,12-Hexaazatriphenylenehexacarboxylic Acid", SYNTHESIS, Apr. 1994, pp. 378-380.

English language Abstract of WO 01/49806, corresponding to JP 2003-519432, Jun. 17, 2003.

English language Abstract of WO 01/49806, corresponding to JP 3614405, Jan. 26, 2005.

* cited by examiner

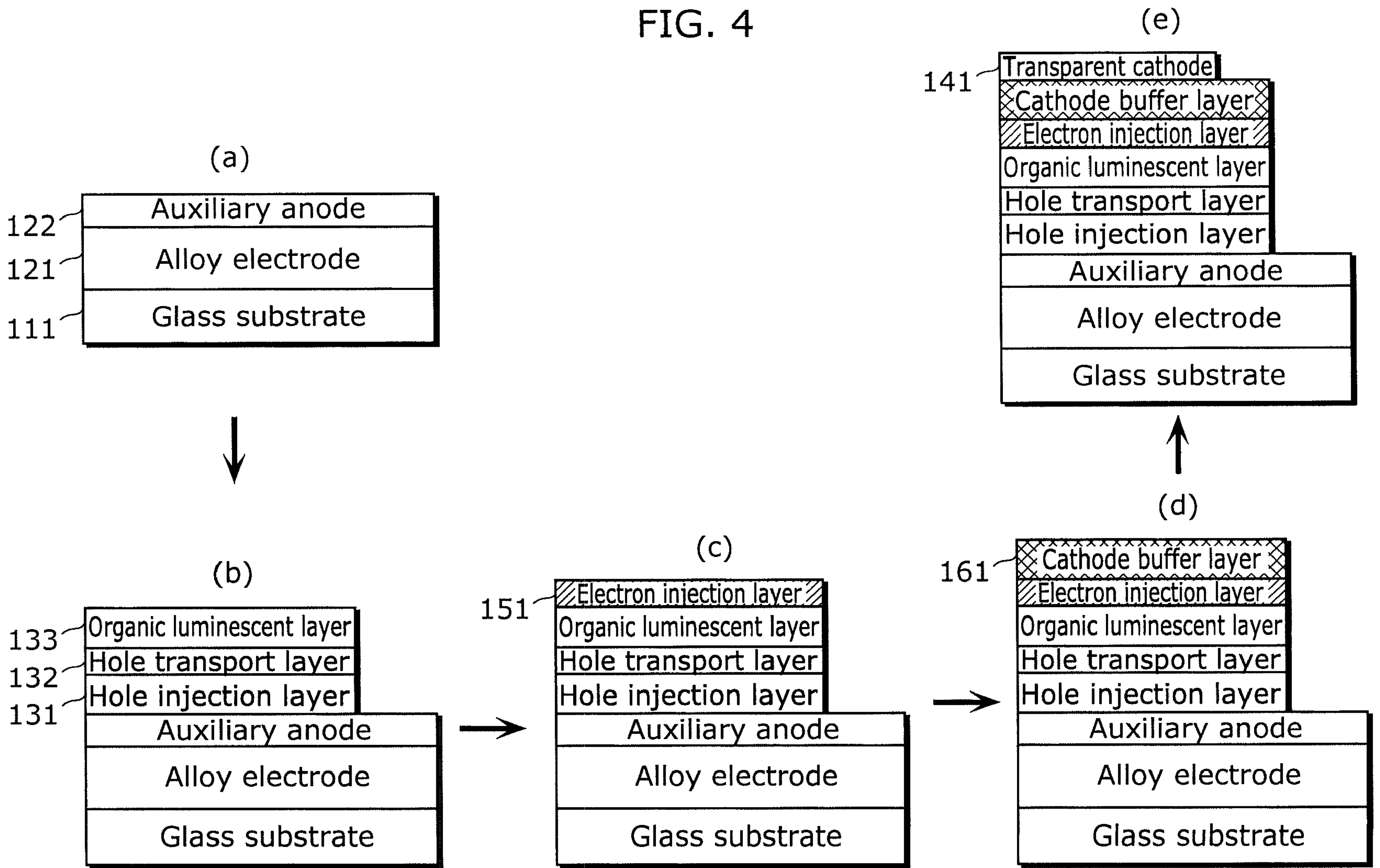
FIG. 4
(a)
Auxiliary anode
Alloy electrode
Glass substrate
122
121
111
(b)
Organic luminescent layer
Hole transport layer
Hole injection layer
Auxiliary anode
Alloy electrode
Glass substrate
133
132
131
(c)
Electron injection layer
Organic luminescent layer
Hole transport layer
Hole injection layer
Auxiliary anode
Alloy electrode
Glass substrate
151
(d)
Cathode buffer layer
Electron injection layer
Organic luminescent layer
Hole transport layer
Hole injection layer
Auxiliary anode
Alloy electrode
Glass substrate
161
(e)
Transparent cathode
Cathode buffer layer
Electron injection layer
Organic luminescent layer
Hole transport layer
Hole injection layer
Auxiliary anode
Alloy electrode
Glass substrate
141

ORGANIC ELECTROLUMINESCENCE ELEMENT

TECHNICAL FIELD

The present invention relates to an organic electroluminescence element and, in particular, to an organic electroluminescence element used for a display device or for lighting.

BACKGROUND ART

An element is called an organic electroluminescence element (hereinafter referred to as an organic EL element) which includes a thin film of an organic material and two electrodes sandwiching the thin film and emits light in response to application of voltage (electroluminescence). In the 1960s, an organic EL element made of a small-molecular organic material was found (see Non-patent Reference 1), and in the 1980s, an element structure with practical properties and a practical process of manufacturing such an element was developed (see Non-patent Reference 2). The organic EL element made of a small-molecular material may be formed as a thin organic film using a vacuum deposition method and manufactured in a condition with less incorporation of foreign matters or dust in a vacuum process. This provides the organic EL element made of a small-molecular material with characteristics of having a long life and less pixel defects. In the early half of the 1990s, an organic EL element made of a polymeric material is reported (see Non-patent Reference 3). The organic EL element made of a polymeric material can be obtained as an organic thin film by applying solution or dispersion, which is obtained by dissolving a polymeric material in solvent, using a wet method. This provides the organic EL element made of a polymeric material with a characteristic that it may be manufactured through a simple process with less material loss under atmospheric pressure. Both of these organic EL elements are characterized by bright light emission, small dependency on viewing angles, easy increase in panel dimensions and decrease in array size, and developed as light sources for displays or lighting in these years.

FIG. 6 is a cross-sectional view of a structure of a conventional organic EL element described in the Non-patent Reference 2. An organic EL element 600 shown in FIG. 6 includes a transparent substrate 601, a transparent bottom electrode 602, an organic layer 603, and a non-transparent top electrode 604. In this structure, the transparent bottom electrode 602 is stacked on the transparent substrate 601, and light emitted from the organic layer 603 is taken out from the substrate side. The non-transparent top electrode 604, which may be a metal electrode, reflects light emitted from the organic layer 603. An organic EL element which has a structure similar to the structure of the organic EL element 600 is hereinafter referred to as a bottom-emission organic EL element.

FIG. 7 is a cross-sectional view of a structure of a conventional organic EL element shown in the Non-patent Reference 1 and others. In this structure, light emitted from the organic layer is taken out from the top electrode side. An organic EL element shown in FIG. 7 includes a non-transparent substrate 701, a non-transparent bottom electrode 702, an organic layer 703, and a transparent top electrode 704. In this structure, the non-transparent bottom electrode 702 is stacked on the non-transparent substrate 701, and light emitted from the organic layer 703 is taken out from the transparent top electrode 704. An organic EL element which has a structure similar to the structure of the organic EL element 700 is hereinafter referred to as a top-emission organic EL element.

Considering applicability to an active-matrix organic EL display which includes an organic EL element and a thin film transistor (hereinafter referred to as a TFT) which drives the organic EL element, a top-emission organic EL element is superior to a bottom-emission organic EL element. This is because the area of a light emission portion in a pixel area of an organic EL element is limited to an area other than the area of a non-transparent TFT and electric wiring on a substrate of a bottom-emission organic EL element in the case of which emitted light is taken out from the substrate side thereof. At the time, design flexibility is limited because the area of the TFT and electric wires within the pixel is required to be as small as possible in order to secure the area of the organic EL with priority.

In the case of a top-emission organic EL element, in contrast, emitted light is taken out from the side opposite to the substrate side thereof, so that the organic EL element can be formed on a TFT layer over the substrate side and the area of the TFT layer may be made as large as a pixel area. With this, the channel width of the TFT is increased, so that current provided for the organic EL element increases. Alternatively, the TFT is increased in number to form a current compensation circuit, so that luminance distribution is made even across the display. In addition, as the area of the organic EL element is increased in proportion to the pixel area, load for light emission per unit element decreases and the life of the display is improved.

Especially for a top-emission organic EL element, which has a great advantage in application to the display, an electrode made of a metal oxide which transmits visible light and has good conductivity, such as indium tin oxide (hereinafter referred to as ITO), is used as the transparent top electrode 704. Because it is difficult to form such a metal oxide into a thin film with good transparency and conductivity by resistance-heating vapor deposition, the film is formed using a sputtering method or plasma.

In a general structure of an organic EL element, a bottom electrode is an anode and a top electrode is a cathode. Especially for an organic EL element made of a polymeric organic material, a polymeric layer is formed using a wet method such as a spin coating method or an inkjet method. Alkali metals, alkali earth metals, and salts thereof used as a cathode with a function to provide electrons are likely to be unstable when reacting with water or oxygen. Accordingly, when a bottom electrode is a cathode, alkali metals, alkali earth metals, or salts thereof included in the bottom electrode reacts with an organic layer, which is a solution layer early in its formation, and causes mutual elution or mutual diffusion at a laminate interface therebetween; resulting in difficulty in control of the laminate interface. In this regard, a structure in which a top electrode is a cathode is employed.

However, a top-emission organic EL element with a top electrode of a transparent electrode has a problem.

The problem is that the sputtering method or the method using plasma for forming an ITO film, which is the transparent top electrode 704, causes great damage to the organic layer underlying the ITO film. This damage causes negative effects to the element, such as instability of driving, deterioration in luminous efficiency, increase in driving voltage, and shortening of the life.

In addition, the transparent electrode made of a metal-oxide such as ITO has an excellent hole injection property owing to its high work function but is not easy to inject electrons. Accordingly, in order to inject electrons through such a transparent electrode of a metal-oxide such as ITO, which is not easy to inject electrons by nature, an electron injection layer which promotes electron injection is required to be provided between the electrode and a luminescent layer.

It is known that alkali metals and alkali earth metals effectively function as the luminescent layer. The alkali metals include lithium, sodium, calcium, rubidium, cesium, francium, and the alkali earth metals include magnesium, calcium, strontium, barium, radium. However, in the case, for example, where an electron injection layer made of barium and an ITO layer contacts each other to form a laminate structure, the barium contacting the ITO layer is oxidized because the ITO is an oxidizer. Thus electron injection performance is significantly deteriorated and the device does not function.

In order to solve this problem, it is effective to provide some buffer layer (hereinafter referred to as a cathode buffer layer) between an electron injection metal and an electrode of a metal oxide typified by ITO.

The following are performance requirements for the cathode buffer layer:

(1) Protect an electron injection metal from oxidization by the transparent cathode (for the purpose of improvement of stability of the element).

(2) Have high transparency (for the purpose of efficient extraction of emitted light generated in the element to the outside of the element).

(3) Protect the electron injection layer and the luminescent layer from damage in processing for forming a film of the transparent cathode (for the purpose of stable drive, high luminous efficiency, and a long life of the element).

(4) Provide excellent transport and injection of electrons from the transparent cathode to the electron injection layer (for the purpose of drive at a low voltage).

For example, a cathode buffer layer for a conventional top-emission organic EL element is disclosed in Patent Reference 2. According to the Patent Reference 2, an organic material which is a mixture of metals with low work functions and has an electron-transport property is used as a cathode buffer layer under a transparent electrode. Mixing metals with low work functions reduces (n-dopes) the electron-transporting organic material which causes radical anion status, thus generating free electrons in a film. Thereby electron injection from the transparent cathode is promoted and conductivity of the cathode buffer layer is increased. This means that the aforementioned performance requirement (4) for the cathode buffer layer is satisfied.

Furthermore, the cathode buffer layer has good transparency. This is owing to the fact that many electron-transporting organic materials have good transparency and the transparency is enhanced because the mixed metals are oxidized to be cationic. This means that the aforementioned performance requirement (2) for the cathode buffer layer is satisfied.

Furthermore, as the film can be thickened without increase in driving voltage or significant decrease in luminous efficiency because of high conductivity and good transparency, the electron injection layer and the luminescent layer are protected from damage due to processing in forming the transparent cathode film. This means that the aforementioned performance requirement (3) for the cathode buffer layer is satisfied.

Patent Reference 1: Japanese Unexamined Patent Application Publication Number 10-162959

Patent Reference 2: Japanese Unexamined Patent Application Publication Number 2004-127740

Non-patent Reference 1: M. Pope et al., Journal of Chemical Physics No. 38, 1963, pp. 2042-2043

Non-patent Reference 2: C. W. Tang and S. A. Van Slyke, Applied Physics Letters, No. 51, 1987, pp. 913-915

Non-patent Reference 3: J. H. Burroughes et al., Nature, 347, 1990, pp. 539-541

DISCLOSURE OF INVENTION

Problems that Invention is to Solve

The cathode buffer layer described in the Patent Reference 2 is subject to oxidization by a transparent oxide electrode such as an ITO layer because the cathode buffer layer which is an electron-transporting organic material with which a metal of a low work function is mixed contains a metal of a low work function and an electron-transporting organic material which is reduced and in radical-anion state. Thus, the cathode buffer layer made of an electron-transporting organic material with which a metal of a low work function is mixed shows exhibits relatively good properties for the performance requirements (2) to (4) but not for (1). Such cathode buffer layer causes a problem of reduction in a device life when the device is driven or stored for a long period of time, which results in a practical problem.

Furthermore, the metal of a low work function is oxidized so easily that it is difficult to handle the metal in air. Thus it is preferable to use as little of the metal of a low work function as possible because there is a manufacturing problem of oxidization of the metal of a low work function when it is provided for a deposition apparatus as a target of deposition.

Although a layer configuration in which a cathode such as an ITO layer is a top electrode and a reducible material is mixed with an electron-transporting organic material has been proposed as described above, no organic EL element of high luminous efficiency and low driving voltage has been obtained with a good operation life or a storage life.

The present invention, conceived to address this problem, has an object of providing an organic EL element which has good life properties and stability.

Means to Solve the Problems

In order to achieve the object, an organic electroluminescence element according to the present invention includes: an anode; a cathode; an organic luminescent layer formed between the anode and the cathode; an electron injection layer which is formed between the cathode and the organic luminescent layer, primarily contains at least one of an alkali metal and an alkali earth metal, and injects electrons into the organic luminescent layer; and a cathode buffer layer which is made of a hole-transporting organic material and is formed between the electron injection layer and the cathode.

The hole-transporting organic material is easily cationized (or to have holes) because of its electron-donating property and transports the resulting holes by a charge-transfer reaction between molecules by its nature. With this, the organic EL device has a function of transporting an electron from the cathode and the electron injection layer. Furthermore, because the cathode buffer layer which contains such a hole-transporting organic material is resistant to oxidization, the cathode buffer layer is easy to handle in air and thus deterioration in properties can be suppressed. Furthermore, because the electron injection layer including an alkali metal or an alkali earth metal is inserted between the cathode buffer layer and the organic luminescent layer, the electron injection layer and the organic luminescent layer are protected from plasma or heat in forming the cathode. Furthermore, electrons are stably provided for the organic luminescent layer without oxidization of the alkali metal and the alkali earth metal.

Thus, time degradation is suppressed and stability in driving and storage of the element is improved.

The cathode buffer layer preferably contains a material which makes the hole-transporting organic material electron-deficient.

With this, conductivity of the element is improved as a result of promotion of generation of movable hole charges in the cathode buffer layer. Thus, the element is driven at a lower voltage.

The material which makes the hole-transporting organic material electron-deficient is preferably a fullerene.

The fullerene is more preferably fullerene C60.

Fullerenes are preferred for use as materials which make such a hole-transporting organic material electron-deficient because they are electron accepting, and C60 is particularly preferable. With this, the element is driven at a lower voltage.

The material which makes the hole-transporting organic material electron-deficient is preferably a transition metal oxide.

The transition metal oxide is more preferably at least one of molybdenum oxide, tungsten oxide, and vanadium oxide.

Transition metal oxides are preferred for use as materials which make such a hole-transporting organic material electron-deficient because they are electron accepting. Molybdenum oxide, tungsten oxide, and vanadium oxide, for which absolute values of energy levels of their conductive bands are 4.0 eV or higher with respect to a vacuum level and have a strong tendency to take electrons (or these materials are oxidative), are particularly preferable. With this, the element is driven at a lower voltage.

The material which makes the hole-transporting organic material electron-deficient is preferably an organic material for which an absolute value of an energy level of a lowest unoccupied molecular orbital is 4 eV or higher with respect to a vacuum level.

The material which makes the hole-transporting organic material electron-deficient is more preferably an organic compound having a cyano group or an organic compound having a structure of a cyclic molecule which includes a carbon nitrogen double bond.

Organic materials for which absolute values of energy levels of their lowest unoccupied molecular orbitals are 4 eV or higher with respect to a vacuum level have a strong tendency to take electrons (or these materials are oxidative) and are preferred for use as materials which make such a hole-transporting organic material electron-deficient. An organic compound having a cyano group or an organic compound having a structure of a cyclic molecule which includes a carbon nitrogen double bond is particularly preferable for use as a material which makes such a hole-transporting organic material electron-deficient because they tend to have lowest unoccupied molecular orbitals for which values of energy levels are large with respect to a vacuum level. With this, the element is driven at a lower voltage.

The electron injection layer may be stacked in contact with and on a surface of the organic luminescent layer.

This makes it unnecessary to stack an organic layer having a function of transporting electrons directly on the organic luminescent layer; thus material costs are reduced and a process of forming layers is simplified.

The organic luminescent layer is preferably made of a polymeric organic compound.

With this, the organic luminescent layer is obtained by applying solution or dispersion, which is obtained by dissolving organic high molecules, using a wet method, so that simple process at atmospheric pressure can be employed and loss of a material can be reduced. Thus, productivity is improved.

The anode, the organic luminescent layer, the electron injection layer, the cathode buffer layer, and the cathode are preferably stacked in order on a substrate, the cathode being a transparent electrode which transmits light and the electron injection layer having a thickness between 1 nm and 20 nm inclusive.

With this, a high luminescent efficiency is achieved with a top-emission organic EL element, which allows light emission from an upper layer side of the organic luminescent layer, because light emitted from the organic luminescent layer is neither reflected by the electron injection layer nor absorbed by the cathode.

The present invention may be embodied not only as an organic electroluminescence element with characteristics described above but also as a display panel for which has the same configuration and effects when the display panel includes such an organic electroluminescence element.

The present invention may be embodied not only as an organic electroluminescence element with such characteristics but also as a method for manufacturing an organic electroluminescence element for which the characteristics are provided through steps.

Effects of the Invention

In an organic EL element according to the present invention, an electron injection layer promotes injection of electrons from a cathode to an organic luminescent layer, a cathode buffer layer allows easy handling of the organic EL element in air, and deterioration in properties is suppressed; thus an organic EL element with a good operation life and good stability in storage is provided.

BRIEF DESCRIPTION OF DRAWINGS

FIG. 4 including (a) to (e) is a process chart which shows a method for manufacturing an organic EL element according to a first example according to the present invention.

BEST MODE FOR CARRYING OUT THE INVENTION

An organic electroluminescence element (hereinafter referred to as an organic EL element) according to the present embodiment includes an anode, a cathode, an organic luminescent layer which is formed between the anode and the cathode, an electron injection layer which is formed between the cathode and the organic luminescent layer and is a metal primarily containing at least one of an alkali metal and an alkali earth metal, and injects electrons to the organic luminescent layer, and a cathode buffer layer which is formed between the electron injection layer and the cathode and contains a hole-transporting organic material. With this, the organic EL element has a function of transporting electrons from the cathode and the electron injection layer. Furthermore, because the cathode buffer layer is resistant to oxidization, the cathode buffer layer is easy to handle in air and thus deterioration in properties can be suppressed. Furthermore, the cathode buffer layer protects the electron injection layer and the luminescent layer from plasma or heat in forming the cathode. Thus, the element is improved in stability of driving and storage.

An embodiment of the present invention is hereinafter described in detail with reference to the drawings.

Figure 1:
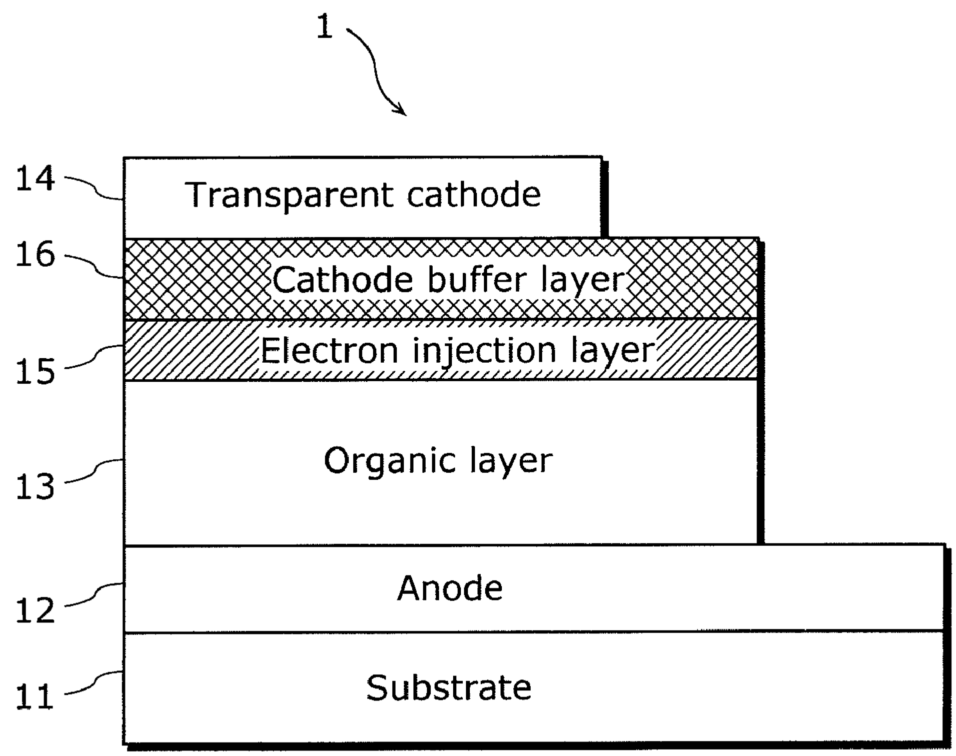
FIG. 1 is a sectional view of a structure of an organic EL element according to the embodiment of the present invention.

FIG. 1 is a sectional view of a structure of an organic EL element according to the embodiment of the present invention. An organic EL element 1 in FIG. 1 includes a substrate 11, an anode 12, an organic layer 13, a transparent cathode 14, an electron injection layer 15, and a cathode buffer layer 16.

The substrate 11 may be made of a material such as, but not limited to, a glass substrate, a quartz substrate, or the like. The organic EL element may be provided with flexibility by using a plastic substrate made of, for example, polyethylene terephthalate or polyethersulfone. A non-transparent plastic substrate or a metal substrate may be used because the structure according to the present invention has advantageous effects especially on top-emission organic EL elements as described above. Furthermore, metal wiring or a transistor circuit to drive the organic EL element may be formed on the substrate.

The anode 12 may be made of, but not limited to, reflective metal. The reflective metal may be made of one of metals listed below, an alloy thereof, or a laminate of them: silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, cobalt, molybdenum, silicon.

The organic layer 13 includes layers formed in order of a hole injection layer, a hole transport layer, and an organic luminescent layer from the anode 12. The layers to be included in the organic layer 13 may not be limited to them. The hole injection layer has a function of stably injecting holes injected from the anode 12 into the hole transport layer or a function of promoting generation of holes and injecting the generated holes. The hole transport layer has a function of transporting the holes injected from the hole injection layer into the organic luminescent layer. The organic luminescent layer has a function of emitting light caused in excitation state which is created by recombination of injected holes and electrons.

The organic layer 13 may include a single layer of the organic luminescent layer or a laminate in which layers including at least one organic luminescent layer are stacked. Alternatively, the organic layer 13 may include an inorganic layer when including at least one organic luminescent layer. The organic layer 13 may be made of a small-molecular organic compound or a polymeric organic compound. A small-molecular organic material may be formed using a method such as, but not limited to, a resistance-heating vapor deposition method preferably. A polymeric organic material may be formed using a method such as, but not limited to, a casting method typified by a spin-casting method, a coat method typified by a dip-coating method, or a wet-printing method typified by an inkjet preferably.

When using a polymeric organic compound as the organic layer 13, the organic layer is obtained by applying a solution or a dispersion which is obtained by dissolving organic large molecules, so that simple process at atmospheric pressure can be employed and loss of a material can be reduced. Thus, productivity is improved.

The electron injection layer 15 has a function of promoting generation of electrons and injecting the electrons into the organic luminescent layer included in the organic layer 13. The electron injection layer 15 is a layer of a metal primarily containing at least one of an alkali metal and an alkali earth metal. The electron injection layer 15 may include two or more of alkali metals and alkali earth metals. This means that the electron injection layer 15 may include both of an alkali metal and an alkali earth metal. The electron injection layer 15 may be made of a material such as, but not limited to, lithium, rubidium, cesium, calcium, or barium preferably.

The thickness of the electron injection layer 15 is preferably 1 to 20 nm and more preferably 3 to 7 nm. When an upper layer is deposited on the electron injection layer 15 which is too thin, the electron injection layer 15 is easily deteriorated by water or oxygen which originally exists therein or intrudes from the outside of the electron injection layer 15, so that providing properties such as low voltage and high efficiency is difficult. The water and oxygen may enter the electron injection layer 15 in the case of deposition of the upper layer, adsorption into the electron injection layer 15, or intrusion from the outside of the organic EL element 1, and thus it is impossible to remove the water and oxygen completely. On the other hand, in the case where the electron injection layer 15 is too thick, obtaining high luminous efficiency is difficult. This is because the electron injection layer 15 made of such materials is a metal layer which generally transmits no light, and thus the light generated in the organic layer is absorbed or confined in the element.

The electron injection layer 15 may include a material other than an alkali metal and an alkali earth metal when needed. For example, having aluminum included in the electron injection layer 15 to provide a layer of an alloy contributes to improvement in stability of the electrode. The electron injection layer 15 including such a material may be formed using a method such as, but not limited to, a resistance-heating vapor deposition or electron beam deposition preferably.

Because the electron injection layer 15 is stacked directly on the organic luminescent layer, stacking an organic layer having a function of transporting electrons is omitted. Thereby material costs are reduced and a process of forming layers is simplified. This structure has advantageous effects especially for an organic electroluminescence element having a polymeric organic luminescent layer, which is advantageous in cost reduction for process simplification using a wet method.

The cathode buffer layer 16 includes a hole-transporting organic material. The hole-transporting organic material is defined as an organic material which is easily cationized (or to have holes) because of its electron-donating property and transports the resulting holes by a charge-transfer reaction between molecules by its nature. This material may be referred to as a p-type organic semiconductor. The cathode buffer layer 16, which is provided between the cathode and the electron injection layer, has a function of transporting charges.

The cathode buffer layer 16 is resistant to oxidization in forming the transparent cathode 14, which is the upper layer thereof, because the hole-transporting organic material is resistant to oxidization by its nature. Thus, degradation of charge transport performance is suppressed.

Furthermore, forming the cathode buffer layer 16 allows protection of the electron injection layer 15 and the organic luminescent layer from damage by plasma in forming the transparent cathode 14.

The cathode buffer layer 16 may be made of a material such as, but not limited to, aromatic amine. Preferable materials thereof include derivatives of triphenylamine represented by FORMULA 1 below:

[FORMULA 1]

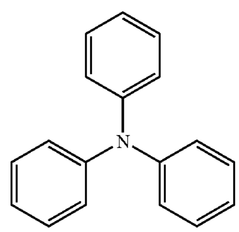

Specifically, derivatives of triphenylamine may be substances which have polycyclic aromatic substituents, such as a naphthyl group and an anthranil group, instead of three phenyl groups in the chemical structure shown in FORMULA 1 and may be derivatives of such substances. Substances which have another substituent, such as an aliphatic substituent or an aromatic substituent instead of hydrogen in the phenyl groups are also applicable. The molecule may have not only one amino group but two or more. Hereinafter, these derivatives of triphenylamine are collectively referred to as triarylamine derivatives.

Triarylamine derivatives have the aforementioned properties as described by Y. Shirota and H. Kageyama in Chem. Rev., No. 107, 2007, pp. 953-1010 (Non-patent Reference 4). FORMULA 2 represents a compound which is one of the triarylamine derivatives.

[FORMULA 2]

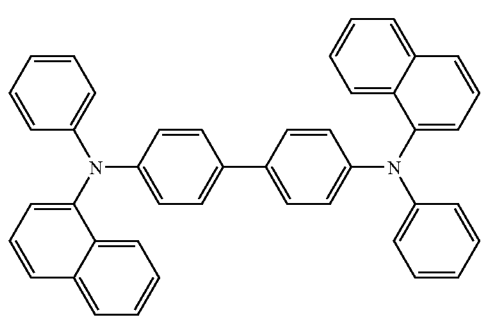

The compound (hereinafter referred to as NPD) has a hole mobility (given in $cm^2/Vcm$) which is represented using $10^{-4}$ as the exponential part in scientific notation, and an energy level of the highest occupied molecular orbital of NPD is 5.1 eV as described by Y. Shirota and H. Kageyama in Chem. Rev., No. 107, 2007, pp. 953-1010 (Non-patent Reference 4).

The cathode buffer layer 16 may be formed using a method such as, but not limited to, resistance-heating vapor deposition method preferably.

Aromatic amines used as the cathode buffer layer 16 include those represented by formulae below.

[FORMULA 3]

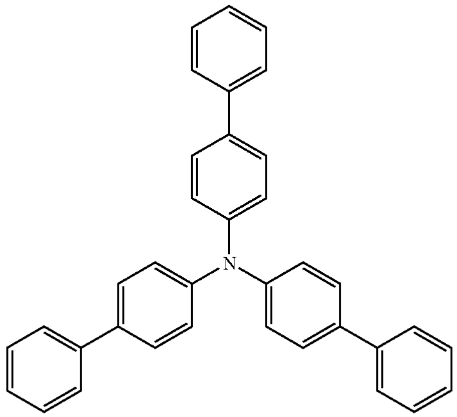

[FORMULA 4]

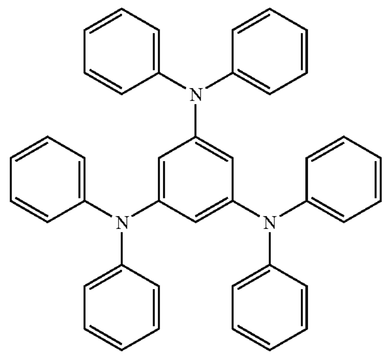

[FORMULA 5]

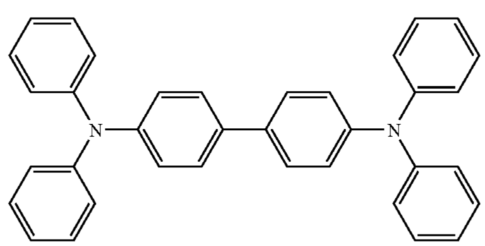

[FORMULA 6]

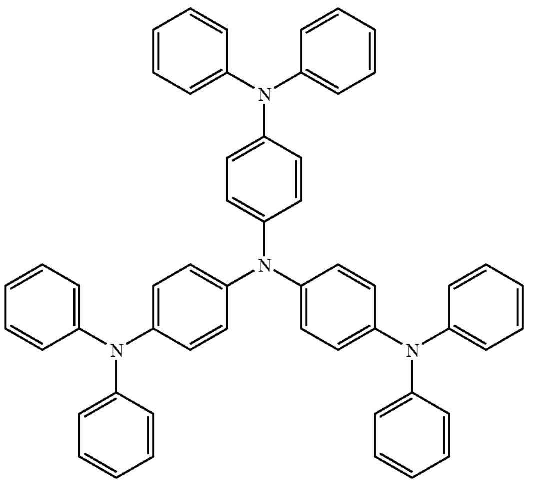

-continued

[FORMULA 7]

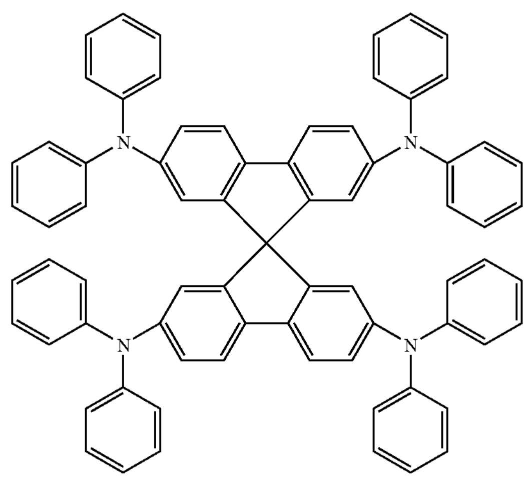

These are general formulae and hydrogen in each of the benzene rings shown in FORMULA 3 to FORMULA 7 may be substituted by another substituent. The substituent may be halogen, an alkyl group, an alkenyl group, an alkynyl group, an alkoxy group, a phenoxy group, an naphthyl group, an anthryl group, a pyridyl group, a thienyl group, a diphenyl amino group, a diphenylamino phenyl group, or a carbazolyl group, for example. In the case where the substituent includes an aromatic ring, hydrogen in each of the benzene rings may be substituted by an alkyl group. Furthermore, each of the benzene rings may be a part of a fused aromatic ring. The fused aromatic ring may be, for example, naphthalene, anthracene, quinoline, or coumarin.

The derivatives of triphenylamine which are used as the cathode buffer layer 16 includes not only the aforementioned triarylamine derivatives but also carbazole derivatives. Exemplary ones of the carbazole derivatives are those represented by the formulae below.

[FORMULA 8]

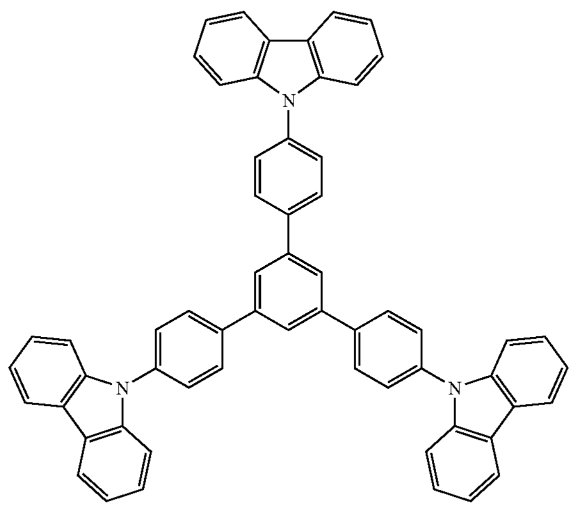

-continued

[FORMULA 9]

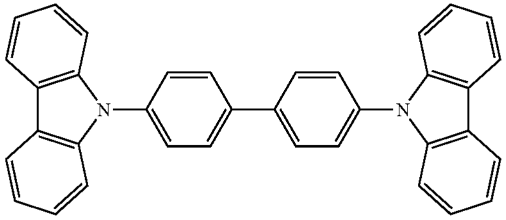

These are general formulae and hydrogen in each of the benzene rings shown in FORMULA 8 to FORMULA 9 may be substituted by another substituent. The substituent may be, for example, halogen, an alkyl group, an alkenyl group, an alkynyl group, an alkoxy group, a phenoxy group, a naphthyl group, an anthryl group, a pyridyl group, a thienyl group, a diphenyl amino group, a diphenylamino phenyl group, or a carbazolyl group. In the case where the substituent includes an aromatic ring, hydrogen in each of the benzene rings may be substituted by an alkyl group. Furthermore, each of the benzene rings may be a part of a fused aromatic ring. The fused aromatic ring may be, for example, naphthalene, anthracene, quinoline, or coumarin.

The transparent cathode 14 may be made of a material such as, but not limited to, indium tin oxide or indium zinc oxide. The transparent cathode 14 may be formed using a method such as, but not limited to, a sputtering method such as DC sputtering, rf sputtering, magnetron sputtering, or ECR sputtering, or a plasma-assisted vapor deposition method preferably.

Because the cathode buffer layer 16 including a hole-transporting organic material according to the present embodiment is resistant to oxidization, the cathode buffer layer is easy to handle in air and thus deterioration in properties of the organic EL element 1 is suppressed. Furthermore, because the electron injection layer 15 including an alkali metal or an alkali earth metal is inserted between a cathode buffer layer 16 and the organic luminescent layer, the electron injection layer 15 and the organic luminescent layer are protected from plasma or heat in forming the cathode. Furthermore, the function of transporting electrons from the cathode to the electron injection layer is thereby secured, so that electrons are stably provided for the organic luminescent layer without oxidization of the alkali metal and the alkali earth metal. Thus, time degradation is suppressed and the element is improved in stability of driving and storage.

Figure 2:
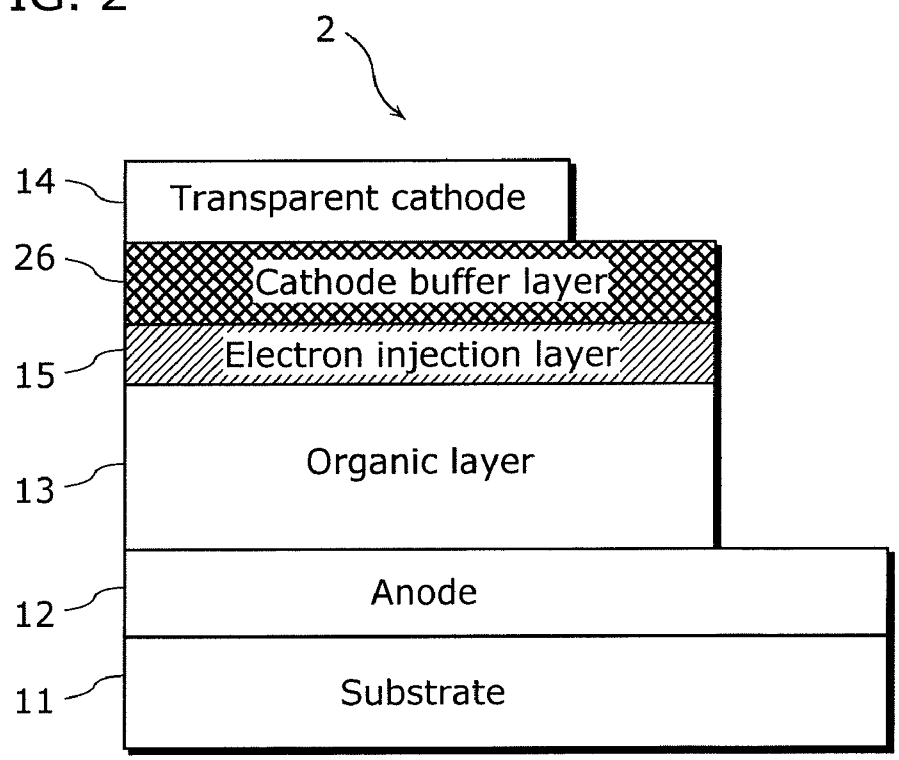
FIG. 2 is a sectional view of a structure of an organic EL element according to a variation of the embodiment of the present invention.

FIG. 2 is a sectional view of a structure of the organic EL element according to a variation of the embodiment of the present invention. An organic EL element 2 in FIG. 2 includes the substrate 11, the anode 12, the organic layer 13, the transparent cathode 14, the electron injection layer 15, and a cathode buffer layer 26.

In comparison with the organic EL element 1 shown in FIG. 1, the organic EL element 2 shown in FIG. 2 is different from the organic EL element 1 only in the structure of the cathode buffer layer. Detailed description of common points is omitted and only differences between them are hereinafter described.

The cathode buffer layer 26 includes not only a hole-transporting organic material which the cathode buffer layer 16 is made mainly of but also a material which makes the hole-transporting organic material electron-deficient.

According to the present invention, an advantageous effect of improving the element in stability of driving and storage is achieved even only with the triarylamine derivative as in the case of the organic EL element shown in FIG. 1. An organic EL element provided with the cathode buffer layer 26, such as the organic EL element 2 shown in FIG. 2, is more useful because the cathode buffer layer 26 which includes the material which makes the hole-transporting organic material electron-deficient (p-doping) has an advantageous effect of lowering driving voltage of the element. This is because conductivity of the element is improved as a result of promotion of generation of movable hole charges in the cathode buffer layer caused by electron deficiency of the hole-transporting organic material.

Here, electron deficiency of the hole-transporting material is defined as a state in which the hole-transporting material has fewer electrons than when neutral. Thus, this definition covers not only the case where electrons are completely extracted from a hole-transporting material to make the hole-transporting material cationized but also the case where charges are transported between the hole-transporting material and the material which makes the hole-transporting material electron-deficient and thereby a charge-transport complex or a weak ion pair is formed. In order to analytically detect a change between an state where electrons have been extracted and a neutral state, measuring electronic an absorption spectrum of the layer and monitoring for an absorption band which is not in the neutral state is one of effective methods. For example, an electronic absorption band is newly formed when a charge-transport complex is formed as described by X. Zhou et al. in Adv. Funct. Mater., No. 11, 2001, pp. 310-314 (Non-patent Reference 5).

The material which makes the hole-transporting organic material included in the cathode buffer layer 26 electron-deficient is preferably an electron-accepting material. This material may preferably be but not limited to a fullerene and more preferably be a fullerene C60. Fullerenes are suitable for use according to the present invention because lowest unoccupied molecular orbitals thereof which accept electrons have energy levels of higher than 3.0 eV with respect to a vacuum level and such fullerenes take electrons of aromatic organic materials.

The material which makes the hole-transporting organic material electron-deficient may preferably be a transition metal oxide and more preferably be molybdenum oxide, tungsten oxide, or vanadium oxide. These materials are suitable for use according to the present invention because they have conduction bands, which accept electrons and for which absolute values of energy levels are 4.0 eV or higher with respect to a vacuum level, and take electrons (or these materials are oxidative).

The material which makes the hole-transporting organic material electron-deficient may preferably be an organic compound for which an absolute value of an energy level of a lowest unoccupied molecular orbital is 4.0 eV or higher with respect to a vacuum level, and more preferably an organic compound having a cyano group or an organic compound having a structure of a cyclic molecule which includes a carbon nitrogen double bond. This is because a material having such a substituent or a chemical structure tends to have a lowest unoccupied molecular orbital for which a value of an energy level is large with respect to a vacuum level and appropriate design of a chemical structure of the material lowers the energy level to 4 eV or lower. For example, a compound represented by FORMURA 10 below is one of such compounds.

[FORMULA 10]

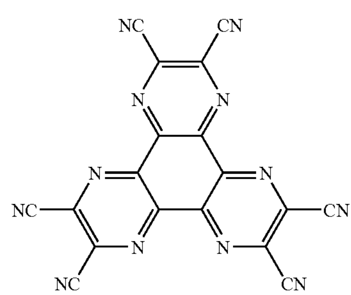

This compound (hereinafter referred to as 6CN) is described in Japanese Patent No. 3614405 (Patent Reference 3) and Japanese Unexamined Patent Application Publication Number 2007-230974 (Patent Reference 4). In contrast, it is difficult to achieve the aforementioned effect of lowering driving voltage because electrons are not extracted effectively enough when using a material having an energy level of lower than 4 eV.

Figure 3:
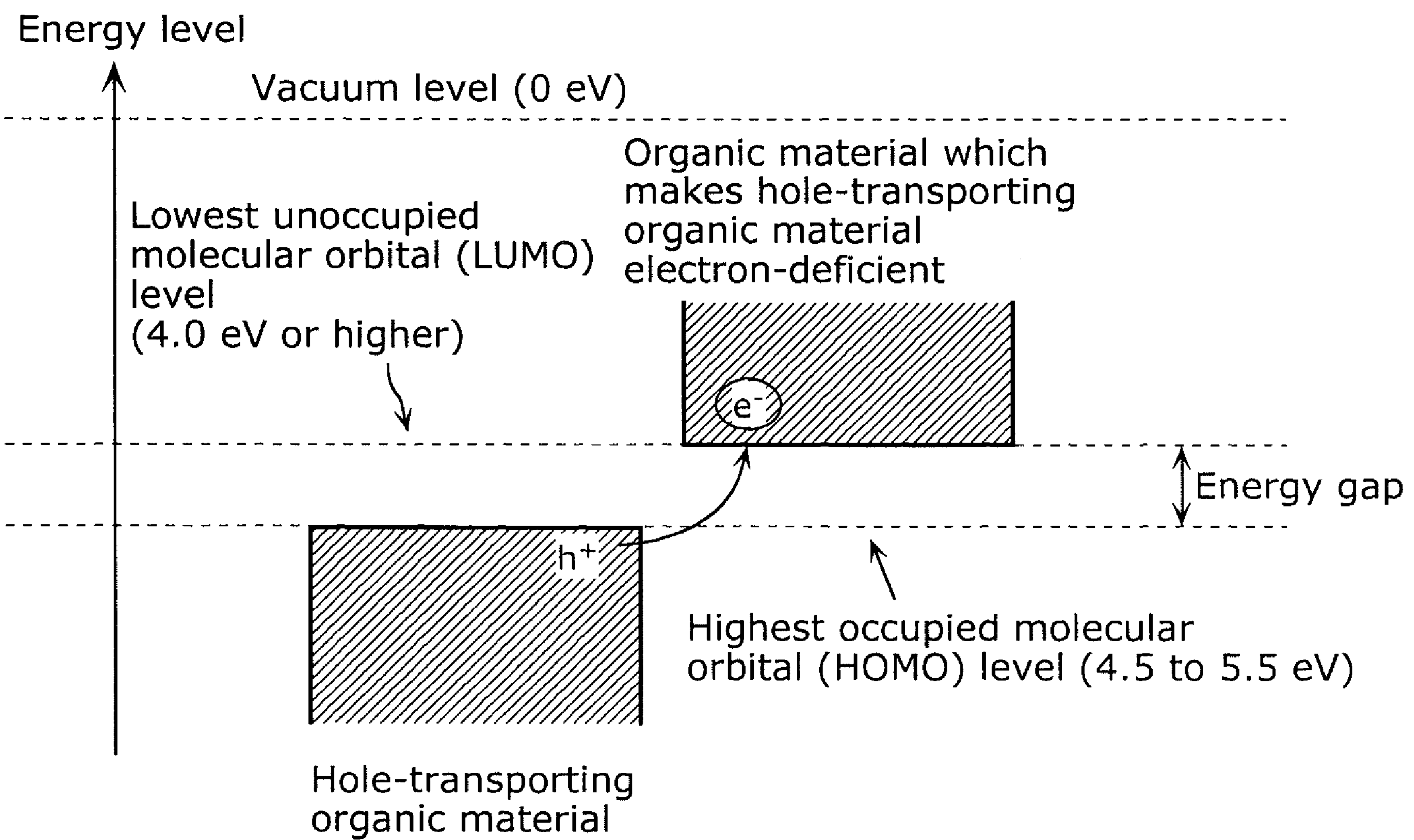
FIG. 3 is a schematic diagram of energy levels of a hole-transporting organic material and a material which makes the hole-transporting organic material electron-deficient.

Described hereinafter with reference to FIG. 3 is a reason why it is preferable to use, as the material which makes the hole-transporting organic material electron-deficient, a material with the lowest unoccupied molecular orbital for which an absolute value of an energy level is 4.0 eV or higher with respect to a vacuum level.

FIG. 3 is a schematic diagram of energy levels of a hole-transporting organic material and a material which makes the hole-transporting organic material electron-deficient. The hole-transporting organic material generally has a highest occupied molecular orbital for which energy levels are within a range of 4.5 to 5.5 eV with respect to a vacuum level which is common between the hole-transporting organic material and the material which makes the hole-transporting organic material electron-deficient. Electrons are effectively moved from the highest occupied molecular orbital of the hole-transporting organic material to the lowest unoccupied molecular orbital of the material which makes the hole-transporting organic material electron-deficient when an energy gap shown in FIG. 3 is small. It is thus preferable that the energy level of the lowest unoccupied molecular orbital of the material which makes the hole-transporting organic material electron-deficient is 4 eV or higher.

The cathode buffer layer 26 may be formed using a method such as, but not limited to, a resistance-heating vapor codeposition method.

In the cathode buffer layer 26 of the organic EL element 2 according to the variation of the present invention, conductivity of the organic EL element 2 is improved as a result of promotion of generation of movable hole charges. Thus, the element is driven at a lower voltage.

Such hole-transporting materials have not been used for conventional cathode buffer layers for the following reason. A cathode buffer layer serves to transport electrons from a cathode to an electron injection layer. In other words, the cathode buffer layer serves to pass electrons from a work function level of a cathode layer to a work function level of an electron injection layer or a LUMO level. Considering a barrier of election injections, it is preferable that an electron-injection level of a cathode buffer layer is close to electron-injection levels of a cathode and an electron injection layer. In this regard, it has been common practice that electrons are transported utilizing a LUMO level of a material usually used as an electron-transporting material for organic EL elements.

The organic EL element according to the present invention is achieved on the basis of a concept that an organic EL element including a cathode buffer layer made of a hole-transport material provides electron-transport performance which matches that of an organic EL element made using an electron-transporting material. Such performance is achieved by providing an efficient ohmic conjunction or tunnel injection at an interface of the cathode buffer layer by giving free electrons to the cathode buffer layer by mixing p-dopant with the hole-transporting organic material.

EXAMPLES

The present invention is hereinafter described with examples and a comparative example.

First Example

FIG. 4 is a process chart which shows a method for manufacturing the organic EL element according to a first example according to the present invention. First, an alloy electrode 121 having a thickness of 100 nm and made of 97% molybdenum and 3% chromium was formed on a glass substrate 111 (made using a flat glass plate manufactured by Matsunami Glass Ind., Ltd.) using a sputtering method. Next, the alloy electrode 121 was patterned into a predetermined form of an anode using a photolithography method. Next, an indium tin oxide electrode having a thickness of 60 nm was formed using a sputtering method as an auxiliary anode on a surface of the patterned alloy electrode 121, and then patterned into a predetermined form of an auxiliary anode 122 using a photolithography method (FIG. 4 (*a*)). The patterned alloy electrode 121 and the auxiliary anode 122 functions as an anode.

Then, the following three layers were formed as organic layers. First, a hole injection layer 131 having a thickness of 60 nm was formed by applying polyethylene dihydroxy thiophene (PEDOT, Baytron P AI 4083, manufactured by TA Chemical Co.) to a surface of the patterned auxiliary anode 122 using a spin coating method and then heating the resulting laminate on a hot plate at 200° C. for 10 minutes. Next, a hole transport layer 132 having a thickness of 20 nm was formed by applying toluene solution HT12 (manufactured by Sumation Co., Ltd.) to a surface of the hole injection layer 131 using a spin coating method and then heating the resulting laminate on a hot plate at 200° C. for 30 minutes under nitrogen. Next, an organic luminescent layer 133 having a thickness of 70 nm was formed by applying xylene solution, Lumation Green, (manufactured by Sumation Co., Ltd.) to a surface of the hole transport layer 132 using a spin coating method and then heating the resulting laminate on a hot plate at 130° C. for 10 minutes (FIG. 4 (*b*)).

Next, an electron injection layer 151 having a thickness of 5 nm was formed by depositing barium (having a purity of 99% or higher, manufactured by Aldrich Co.) on a surface of the organic luminescent layer 133 using a vapor deposition method (FIG. 4 (*c*)).

Next, a cathode buffer layer 161 having a thickness of 10 nm was formed by depositing NPD (manufactured by Nippon Steel Chemical Co., Ltd.), which is an example of triarylamine derivatives, on a surface of the electron injection layer 151 using a vapor deposition method (FIG. 4 (*d*)).

Next, a transparent cathode 141 having a thickness of 100 nm was formed by depositing a layer of indium tin oxide on a surface of the cathode buffer layer 161 using a plasma-assisted vapor deposition method (using a film forming machine manufactured by Sumitomo Heavy Industries, Ltd.) (FIG. 4 (*e*)).

Finally, although not shown in FIG. 4, the element was sealed with a glass can in a nitrogen dry box in which concentrations of water and oxygen is 1 ppm or lower in order to allow evaluating, in air, the organic EL element which included the formed transparent cathode 141.

Second Example

A method for manufacturing an organic EL element according to a second example of the present invention is all the same as the method according to the first example but differs only in a step in which the cathode buffer layer 161 shown in FIG. 4 was formed to have a thickness of not 10 nm but 20 nm.

Third Example

A method for manufacturing an organic EL element according to a third example of the present invention is all the same as the method according to the first example but differs only in a step in which a cathode buffer layer having a thickness of 20 nm was formed instead of the cathode buffer layer 161 shown in FIG. 4 by codepositing NPD (manufactured by Nippon Steel Chemical Co., Ltd.) and 10-wt-% C60 (having a purity of 99.9% or higher, manufactured by Aldrich Co.) using a vapor deposition method.

Fourth Example

A method for manufacturing an organic EL element according to a fourth example of the present invention is all the same as the method according to the first example but differs only in a step in which a cathode buffer layer having a thickness of 50 nm was formed instead of the cathode buffer layer 161 shown in FIG. 4 by codepositing NPD (manufactured by Nippon Steel Chemical Co., Ltd.) and 10-wt-% C60 (having a purity of 99.9% or higher, manufactured by Aldrich Co.) using a vapor deposition method.

Fifth Example

A method for manufacturing an organic EL element according to a fifth example of the present invention is all the same as the method according to the first example but differs only in a step in which a cathode buffer layer having a thickness of 20 nm was formed instead of the cathode buffer layer 161 shown in FIG. 4 by codepositing NPD (manufactured by Nippon Steel Chemical Co., Ltd.) and 10-wt-% $WO_3$ (having a purity of 99.9% or higher, manufactured by Aldrich Co.) using a vapor deposition method.

Sixth Example

A method for manufacturing an organic EL element according to a sixth example of the present invention is all the same as the method according to the first example but differs only in a step in which a cathode buffer layer having a thickness of 20 nm was formed instead of the cathode buffer layer 161 shown in FIG. 4 by codepositing NPD (manufactured by Nippon Steel Chemical Co., Ltd.) and a 10-wt-% compound 6CN represented by FORMULA 10 using a vapor deposition method. The compound 6CN was synthesized using a method described in "Improved Synthesis of 1,4,5,8,9,12-Hexaazatriphenylenehexacarboxylic Acid", SYNTHESIS, April, 1994, pp. 378-380 (Non-patent Reference 6).

Seventh Example

A method for manufacturing an organic EL element according to a seventh example of the present invention is all the same as the method according to the first example but differs only in a step in which a cathode buffer layer having a thickness of 20 nm was formed instead of the cathode buffer layer 161 shown in FIG. 4 by codepositing NPD (manufactured by Nippon Steel Chemical Co., Ltd.) and a 10-wt-% compound Alq represented by FORMULA 11 below using a vapor deposition method.

[FORMULA 11]

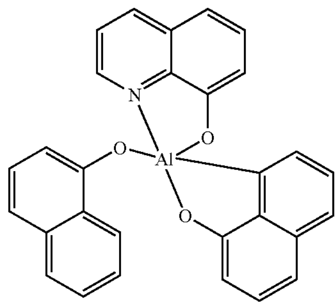

Eighth Example

A method for manufacturing an organic EL element according to a seventh example of the present invention is all the same as the method according to the first example but differs only in a step in which a cathode buffer layer having a thickness of 20 nm was formed instead of the cathode buffer layer 161 shown in FIG. 4 by codepositing a compound TNATA represented by FORMULA 12 below (manufactured by Bando Chemical Industries, Ltd.) and 10-wt-% C60 (having a purity of 99.9% or higher, manufactured by Aldrich Co.) using a vapor deposition method.

[FORMULA 12]

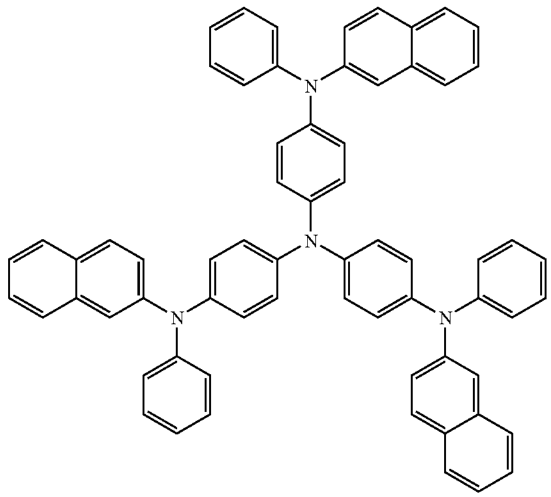

First Comparative Example

A method for manufacturing an organic EL element according to a first comparative example is all the same as the method according to the first example but in a step in which a transparent electrode of ITO was formed directly on a surface of a barium layer which is an electron injection layer without stacking the cathode buffer layer 161 shown in FIG. 4 (that is, instead of the step shown in FIG. 4 (*d*)).

(Evaluation of the Examples and the Comparative Example)

For the first to eighth examples and the comparative example, driving voltages and luminance efficiencies were obtained by measuring driving voltages and luminance when a current of 10 mA/cm$^2$ is applied to the elements in each of which the alloy electrode 121 and the auxiliary anode 122 are positive and the transparent cathode 141 negative. In addition, element lives were obtained by measuring attenuation in luminance of the elements which first emitted light of 400 cd/m$^2$ and kept driving at a constant current. TABLE 1 shows results of evaluation for each of the first to eighth examples and the comparative example.

TABLE 1

| Example no. | Element structure | Driving voltage (V) | Luminous efficiency (cd/A) | Element life (hour) |
|---|---|---|---|---|
| First example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD (10 nm)<br>Transparent cathode: ITO | 10.3 | 7.5 | 80 |
| Second example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD (20 nm)<br>Transparent cathode: ITO | 12.2 | 7.2 | 110 |
| Third example | Alloy electrode: MoCr<br>Auxiliary electrode: ITO<br>Hole injection layer: PEDOT<br>Hole transporting layer: IL | 9.2 | 6.7 | 140 |

TABLE 1-continued

| Example no. | Element structure | Driving voltage (V) | Luminous efficiency (cd/A) | Element life (hour) |
|---|---|---|---|---|
| | Organic luminescent layer: EML<br>Electron injection layer: Ba<br>Cathode buffer layer: NPD + C60 (20 nm)<br>Transparent cathode: ITO | | | |
| Fourth example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD + C60 (50 nm)<br>Transparent cathode: ITO | 9.8 | 6.2 | 130 |
| Fifth example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD + $WO_3$ (20 nm)<br>Transparent cathode: ITO | 9.2 | 5.4 | 90 |
| Sixth example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD + 6CN (20 nm)<br>Transparent cathode: ITO | 9.3 | 7.0 | 150 |
| Seventh example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: NPD + Alq (20 nm)<br>Transparent cathode: ITO | 13.0 | 6.5 | 70 |
| Eighth example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Cathode buffer layer: TNATA + C60 (20 nm)<br>Transparent cathode: ITO | 9.3 | 6.8 | 140 |
| First comparative example | Alloy electrode: MoCr<br>Auxiliary electrode: ITO<br>Hole injection layer: PEDOT<br>Hole transporting layer: IL<br>Organic luminescent layer: EML<br>Electron injection layer: Ba<br>Transparent cathode: ITO | 9.2 | 2.1 | <1.0 |

As shown in TABLE 1, all the alloy electrodes of MoCr are 100 nm thick, all the auxiliary electrodes of ITO are 60 nm thick, all the hole injection layers of PEDOT are 80 nm thick, all the hole transport layers of IL are 20 nm thick, all the organic luminescent layers of EML are 75 nm thick, all the electron injection layers of Ba are 5 nm thick, and all the transparent electrodes of ITO are 100 nm thick.

The conventional element made in the first comparative example emits light at an intermediate luminous efficiency immediately after its manufacture, but, because of lacking a cathode buffer layer, the Ba of the electron injection layer is oxidized by the ITO of the transparent cathode in a short time. Consequently, the luminosity decreases by half on the order of an hour.

In comparison with the first comparative example, the element manufactured in the first example, in which NPD is used as the cathode buffer layer 161, has good stability and moderately deteriorates with age because of its high luminous efficiency and a long luminosity half-life, even though there is a slight increase in its driving voltage. Thus, the cathode buffer layer is necessary to achieve an advantageous effect of the present invention.

The life of the organic EL element according to the present invention is further improved in the second example in which the cathode buffer layer was thickened. In the first example, the cathode buffer layer 161 is so thin that damage due to use of plasma in forming the transparent cathode 141 possibly has an impact on the organic luminescent layer 133. When the cathode buffer layer 161 is thin, it may easily have a pinhole; thus the ITO of the transparent electrode 141 and the Ba of the electron injection layer 151 may contact each other at a spot. With this, the element in the first example is improved by far in comparison with the element in the first comparative example, but further improvement in life for an element with good stability is moderate.

The element in the second example is improved in life. At the same time, driving voltage is relatively high in the second example in comparison with the first example because of the buffer layer thicker than that in the first example. This is possibly because a thicker layer relatively reduces an electric field applied to the cathode buffer layer and thus efficiency of electron injection from the cathode buffer layer into the electron injection layer goes lower. In comparison with the first comparative example, the element in the second example also has good stability and moderately deteriorates with age because of its high luminous efficiency and long luminosity half-life, even though there is a relative increase in its driving voltage.

The elements manufactured in the third to sixth examples are improved in increase in driving voltage by mixing an electron-accepting material such as C60, tungsten oxide, or 6CN with NPD which is a major component of the cathode buffer layer. This is because, as described above, conductivity of the cathode buffer layer is improved as a result of generation of holes in the layer which is caused by electron deficiency of the hole-transporting organic material. In this case, as shown in the fourth example, relative increase in driving voltage as in the second example is quite small even in the case where the cathode buffer layer is thickened to 50 nm. Thus, with the cathode buffer layer which is resistant to oxidization as described as an advantage of the present invention, the element is driven not only with improved stability but also at a lower voltage with higher efficiency.

Comparison of the second example, the sixth example, and the seventh example shows that a LUMO energy level of an organic material used as an electron acceptor is preferably 4.0 eV or lower. In comparison with the case of the sixth example where 6CN (LUMO energy level: 4.3 eV) is used as an electron acceptor, driving voltage is relatively high in the case of the seventh example where Alq (LUMO energy level: 2.8 eV) is used as an electron acceptor.

In the eighth example, TNATA, which is a hole-transporting organic material having a chemical structure different from NPD, is used as the cathode buffer layer. This example shows that the advantageous effect of the present invention is achieved not only when NPD is used as a cathode buffer layer but also when any of a variety of other hole-transporting organic materials is used instead.

An organic EL element used as a display device needs to be made so that it deteriorates with age as moderate as possible while keeping initial performances of luminous efficiency and driving voltage which are parameters for performance evaluation. The element shown in the first comparative example, in which no cathode buffer layer is provided but only an electron injection layer is formed between an organic luminescent layer and a transparent cathode, has insufficient luminous efficiency and rapidly deteriorates with age, so that the element does not achieve performance required for an organic EL element used for a display device.

On the other hand, an organic EL element deteriorates with age as moderate as possible while keeping the initial performances in the case where the organic EL element has the electron injection layer and the cathode buffer layer formed in order between the organic luminescent layer and the transparent cathode as in the first to eighth examples.

As described above, in the case where an organic electroluminescence element according to the present invention has a structure in which cathode is a top electrode, the organic electroluminescence element has a configuration in which an electron injection layer, which primarily contains at least one of an alkali metal and an alkali earth metal, and a cathode buffer layer, which includes a hole-transporting material, are stacked in order between an organic luminescent layer and a cathode which are respectively a lower layer and an upper layer. This structure has the following advantageous effects: (1) Oxidization of the electron injection layer by the transparent cathode is prevented, so that stability of the element is improved; (2) Light generated in the element is efficiently extracted from the element because of high transparency; (3) The electron injection layer and the organic luminescent layer are protected from damage due to processing in forming the transparent cathode film, so that the element is improved in stability of driving, luminous efficiency, and life; and (4) Including a material which makes the hole-transporting organic material electron-deficient in the cathode buffer layer causes generation of movable hole charges in the layer, so that driving voltage of element is lowered.

Although the hole injection layer, the hole transport layer, and the organic luminescent layer in the examples given in the embodiment of the present invention are made of polymeric organic materials, these layers may have the same effects as described for the present evaluation even when made of a small-molecule organic material.

The combination in which organic layers are used is not limited to the combination shown in the present embodiment. For example, the hole injection layer may be omitted or an electron-transporting layer may be inserted.

Another layer may be inserted between the electron injection layer made of an alkali metal or an alkali earth metal and the organic luminescent layer. For example, a layer made of an electron-transporting organic material may be inserted.

Another layer may be inserted between the electron injection layer and the cathode buffer layer. For example, an electron-transporting material, such as a compound Alq represented by the FORMULA 11, may preferably be used as a material for the layer.

The configuration above according to the present invention is described as a configuration of a top-emission organic EL element, it may preferably be used as part of a configuration of an organic EL element in which the top electrode is a cathode. For example, the configuration may include Ba, NPD+10% 6Cn, and Al on an organic luminescent layer. In this case, layers which are above the organic luminescent layer and closer to the cathode need not to be transparent but to have functions of injecting electrons, transporting electrons, and protecting the organic luminescent layer from damage in forming an Al layer. Thus, the electron injection layer and the cathode buffer layer according to the present invention are sufficiently effective in a bottom-emission organic EL element as in the case where they are used in a top-emission organic EL element.

Figure 5:
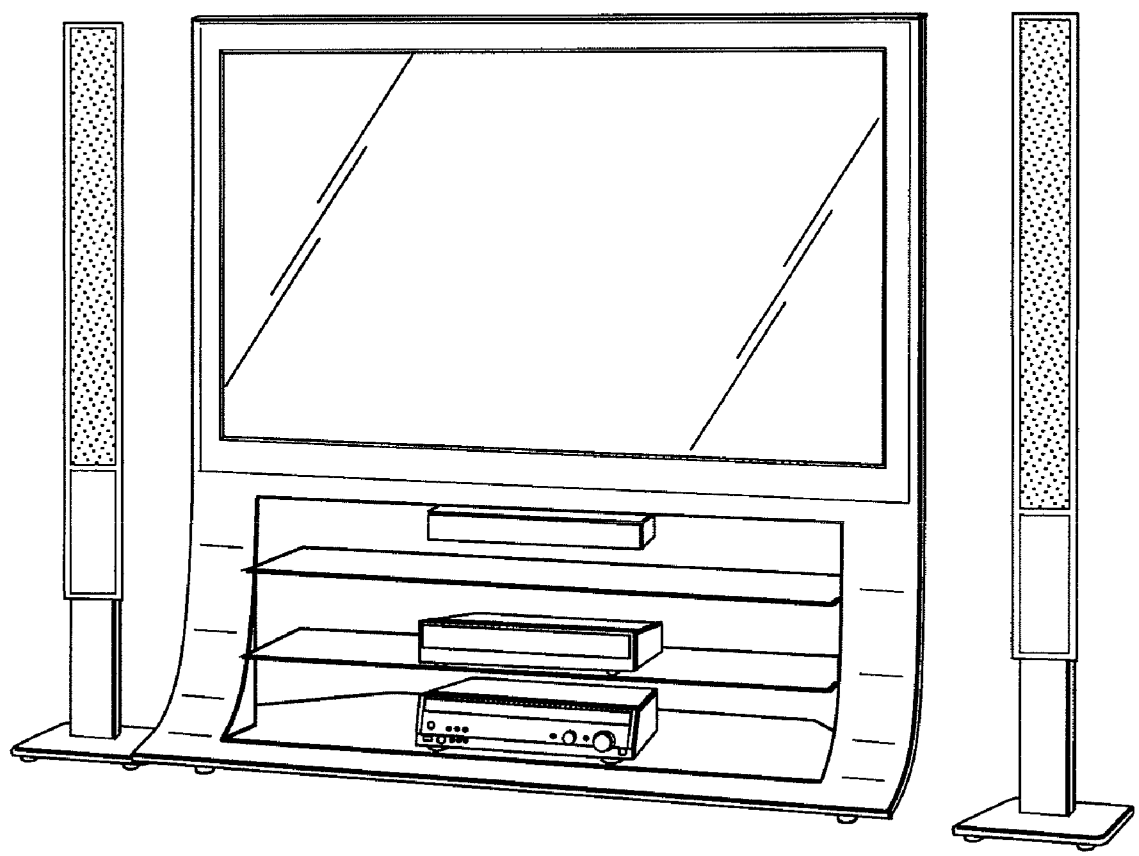
FIG. 5 is an appearance diagram of a TV in which an organic EL element according to the present invention.
Figure 6:
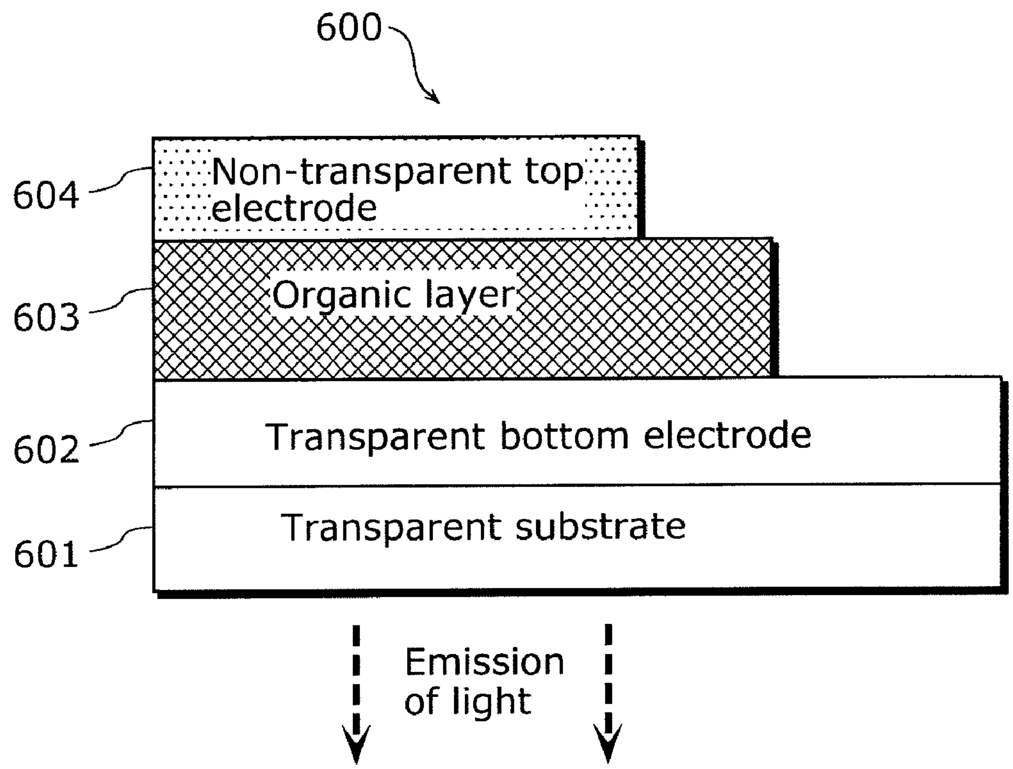
FIG. 6 is a cross-sectional view of a structure of a conventional organic EL element described in the Non-patent Reference 2.
Figure 7:
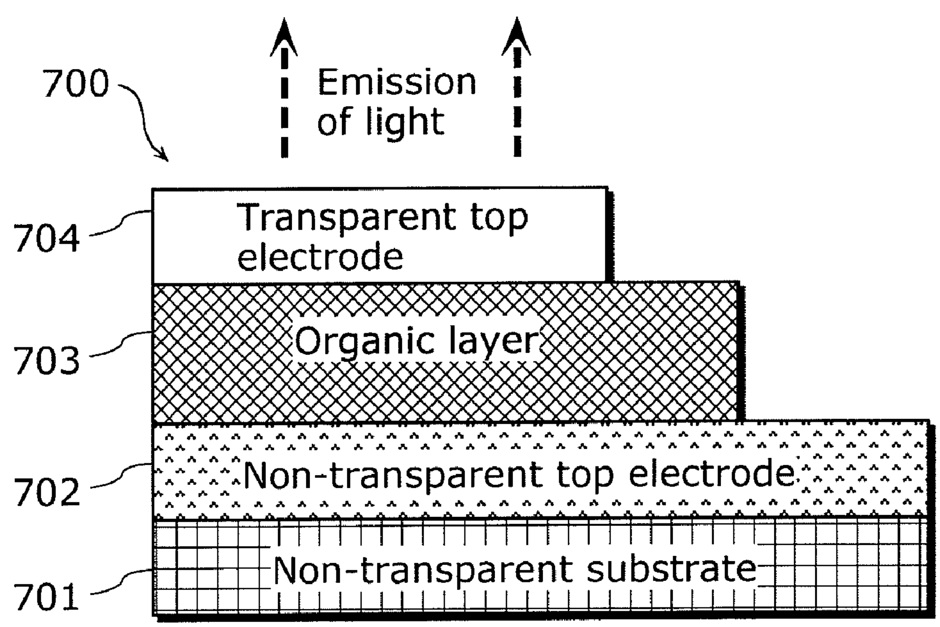
FIG. 7 is a cross-sectional view of a structure of a conventional organic EL element for which light emitted from the organic layer is taken out from the top electrode side.

Electrodes of the organic EL element according to the present invention may be evenly formed either over a substrate or on a large part of a substrate. In this case, large-area emission is achieved; thus the organic EL element may be used for purposes such as lighting. The electrodes may be pattered so that a specific figure or a character may be displayed. In this case, emission is achieved in a specific pattern; thus the organic element may be used for purposes such as advertisement presentation. The electrodes may be arranged in large numbers in rows and columns. In this case, the organic EL element may be used for purposes such as a passive-driven display panel. The electrodes may be formed on a substrate on which an array of transistors is provided so that the electrodes may correspondingly have electrical connections with the array of transistors. In this case, the organic EL element may be used for purposes such as an active-driven display panel as typified by a TV shown in FIG. 5.

The organic EL element and a method for manufacturing the same is described on the basis of but not limited to the embodiment and the examples above. The present invention also includes variations of the present invention conceived by those skilled in the art unless they depart from the spirit and scope of the present invention.

INDUSTRIAL APPLICABILITY

The organic EL element according to the present invention drives at a low voltage with high efficiency and has a long life; thus it is applicable to purposes such as a light source of pixels of a display device, a backlight of a liquid crystal display, a light source of an optical device, and, in particular, an active-matrix organic display panel combined with a TFT.

NUMERICAL REFERENCES

1, 2, 600, 700 Organic EL element
11 Substrate
12 Anode
13, 603, 703 Organic layer
14, 141 Transparent cathode
15, 151 Electron injection layer
16, 26, 161 Cathode buffer layer
111 Glass substrate
121 Alloy electrode
122 Auxiliary anode
131 Hole injection layer
132 Hole transport layer
133 Organic luminescent layer
601 Transparent substrate
602 Transparent bottom electrode
604 Non-transparent top electrode
701 Non-transparent substrate
702 Non-transparent bottom electrode
704 Transparent top electrode

The invention claimed is:

1. An organic electroluminescence element, comprising:
- an anode;
- a cathode that is a transparent electrode;
- an organic luminescent layer located between the anode and the cathode;
- an electron injection layer located between the cathode and the organic luminescent layer, the electron injection layer including at least one of an alkali metal and an alkali earth metal to inject electrons into the organic luminescent layer; and
- a cathode buffer layer located between the electron injection layer and the cathode, the cathode buffer layer including a hole transporting organic material,
- wherein the cathode buffer layer further comprises a material that makes the hole-transporting organic material electron-deficient, and
- wherein the material that makes the hole-transporting organic material electron-deficient is an organic material having an absolute value of an energy level of a lowest unoccupied molecular orbital of at least 4 eV with respect to a vacuum level.

2. The organic electroluminescence element according to claim 1, wherein the material that makes the hole-transporting organic material electron-deficient is an organic compound having one of a cyano group and an organic compound having a structure of a cyclic molecule, the structure of the cyclic molecule including a carbon nitrogen double bond.

3. The organic electroluminescence element according to claim 1, wherein the electron injection layer is stacked in contact with the organic luminescent layer and on a surface of the organic luminescent layer.

4. The organic electroluminescence element according to claim 1, wherein the organic luminescent layer comprises a polymeric organic compound.

5. The organic electroluminescence element according to claim 1, wherein the anode, the organic luminescent layer, the electron injection layer, the cathode buffer layer, and the cathode are stacked in order on a substrate, the cathode transmitting light, and the electron injection layer having a thickness in the range of approximately 1 nm to approximately 20 nm.

6. A display panel comprising the organic electroluminescence element according to claim 1.

7. A method for manufacturing an organic electroluminescence element that includes an anode, an organic luminescent layer, an electron injection layer, a cathode buffer layer, and a transparent electrode cathode, the method comprising:
- stacking the organic luminescent layer on the anode;
- stacking the electron injection layer on the organic luminescent layer, the electron injection layer including at least one of an alkali metal and an alkali earth metal to inject electrons into the organic luminescent layer;
- stacking the cathode buffer layer on the electron injection layer, the cathode buffer layer including a hole-transporting organic material; and
- stacking the transparent electrode cathode on the cathode buffer layer,
- wherein the cathode buffer layer further comprises a material that makes the hole-transporting organic material electron-deficient, and
- wherein the material that makes the hole-transporting organic material electron-deficient is an organic material having an absolute value of an energy level of a lowest unoccupied molecular orbital of at least 4 eV with respect to a vacuum level.

* * * * *